(12) United States Patent
Bauer et al.

(10) Patent No.: US 7,547,645 B2
(45) Date of Patent: Jun. 16, 2009

(54) METHOD FOR COATING A STRUCTURE COMPRISING SEMICONDUCTOR CHIPS

(75) Inventors: Michael Bauer, Nittendorf (DE);
Ludwig Heitzer, Regensburg (DE); Jens Pohl, Bernhardswald (DE); Peter Strobel, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 192 days.

(21) Appl. No.: 11/504,782

(22) Filed: Aug. 16, 2006

(65) Prior Publication Data
US 2007/0105394 A1 May 10, 2007

(30) Foreign Application Priority Data
Aug. 16, 2005 (DE) .................. 10 2005 038 956

(51) Int. Cl.
*H01L 21/20* (2006.01)
(52) U.S. Cl. .................. 438/758; 438/780; 438/781; 257/E23.077
(58) Field of Classification Search .................. 438/758, 438/780–782; 257/E23.077
See application file for complete search history.

(56) References Cited

U.S. PATENT DOCUMENTS

| 3,862,848 | A | | 1/1975 | Marley | |
|---|---|---|---|---|---|
| 6,127,002 | A | * | 10/2000 | Callahan et al. | 427/472 |
| 6,340,641 | B1 | * | 1/2002 | Muraguchi et al. | 438/763 |
| 6,376,148 | B1 | * | 4/2002 | Liu et al. | 430/124.4 |
| 6,448,190 | B1 | * | 9/2002 | Hayashi et al. | 438/778 |
| 6,539,196 | B2 | * | 3/2003 | Ota et al. | 399/333 |
| 6,594,432 | B2 | * | 7/2003 | Chen et al. | 506/32 |
| 6,841,327 | B2 | * | 1/2005 | Otake et al. | 430/123.3 |
| 2003/0010807 | A1 | | 1/2003 | Matthies et al. | |
| 2003/0168612 | A1 | * | 9/2003 | Fudoji et al. | 250/491.1 |

FOREIGN PATENT DOCUMENTS

| DE | 10206438 A1 | 11/2002 |
|---|---|---|
| EP | 0413335 A2 | 2/1991 |

OTHER PUBLICATIONS

Walker, A.; Baldwin, D. F.; Initial Investigations into low-cost ultra-fine pitch solder printing process based on innovative laser printing technology. In: IEEE Transactions on electronics packaging manufacturing, ISSN 1521-334X, 1999, vol. 22, No. 4, 303-307.

* cited by examiner

*Primary Examiner*—Michael S Lebentritt
(74) *Attorney, Agent, or Firm*—Edell, Shapiro & Finnan, LLC

(57) ABSTRACT

A method for coating a structure that includes at least one semiconductor chip involves electrostatically depositing coating particles on the areas of the structure to be coated. The coating particles are first applied to a carrier and the latter is electrostatically charged with the coating particles. The structure including at least one semiconductor chip is charged electrostatically to a polarity opposite to the carrier. The carrier and/or the structure are then moved towards one another in the direction of an area of the structure to be coated until the coating particles jump to the areas of the structure to be coated and adhere there. The coating particles are liquefied by heating the area with coating particles to form a coating.

16 Claims, 3 Drawing Sheets

METHOD FOR COATING A STRUCTURE COMPRISING SEMICONDUCTOR CHIPS

CROSS REFERENCE TO RELATED APPLICATIONS

This application claims priority under 35 U.S.C. §119 to Application No. DE 102005038956.2 filed on Aug. 16, 2006, entitled "Method for Coating a Structure Comprising Semiconductor Chips," the entire contents of which are hereby incorporated by reference.

FIELD OF THE INVENTION

The invention relates to a method for coating a structure which has at least one semiconductor chip.

BACKGROUND

Coatings on structures comprising semiconductor chips are used for mechanically protecting the surfaces of the semiconductor chips. It is known to apply such layers by spraying on, spinning on and/or by dispensing. For this purpose, the coating materials to be applied are put into a low-viscosity state via solvents in order to apply them to the structure comprising semiconductor chips with the aid of application nozzles.

In this process, stepped transitions are a problem since it is difficult to maintain a uniform thickness of the coating on stepped transitions. A further problem lies in applying coatings of materials which cannot be liquefied by solvents.

SUMMARY

The invention provides a method for coating a structure which has at least one semiconductor chip, which can be used for complex structures. According to an exemplary method, coating particles are applied to a carrier. The carrier comprising coating particles is then electrostatically charged. Finally, a structure comprising at least one semiconductor chip is charged to a polarity which is opposite to the carrier. Subsequently, the carrier and/or the area of the structure to be coated are moved towards one another until the coating particles jump over to the area of the structure to be coated and adhere to it there. Subsequently or simultaneously, the area comprising coating particles on the structure is heated up by heating the area until the coating particles become liquefied and form a uniformly thick coating.

This method has the advantage that the composition of the coating particles is independent of solvents so that coatings of coating particles which cannot be dissolved in a solvent and cannot be obtained in dilute viscosity can also be produced. A further advantage of the method is that in the electrostatic process of depositing particles on an area of the structure to be coated, the particles are repelled by the structure which land on areas which enable the particles to be rapidly discharged.

This applies, in particular, to metallic areas on the semiconductor chip so that, using this method, for example external contacts, external contact areas and surface-mountable contact structures can be kept free of a coating by coating particles without requiring masking. Whereas, for example on a solder resist, the electrostatically charged particles survive for a relatively long time and cannot deliver their charge to the semiconductor chip of the structure charged with opposite polarity, this area, in particular, can be reinforced with filled polymers whereas the contact areas or flipchip contacts of the semiconductor chip which are to be kept free for contacting or bonding remain completely free of coating particles. This selective deposition on insulated areas of the structure or of the surface of the structure opens up new design possibilities since no masking is required at all.

Thus, for example, the solder resist layer for flipchip contacts can be reinforced to such an extent that a semiconductor component of the size of semiconductor chips can be provided with a protective package of a few microns without the flipchip contacts or the external contact surfaces or other metallic surfaces on the active top of such a semiconductor chip being contaminated by the coating particles. Since, on the other hand, the particles survive longer on surfaces which do not permit any exchange of electrical charges, that is to say especially on surfaces with an insulation layer, the possibility exists to delay a liquification of the particles on the area to be coated until, in practice, the structure with the semiconductor chip is arranged in a temperature-controlled oven.

However, the method also permits areas permitting a high exchange of electrical charges to be fully coated with a corresponding coating of coating particles of the carrier by preheating the structure with semiconductor chips so that coating particles jumping over are liquefied when they arrive on the area of the structure to be coated even before there is any charge carrier exchange. In this variant of the method, a closed coating of the semiconductor chip or other areas of the structure to be coated is produced so that this variant of the method provides complete protection, for example of a semiconductor component with a thin plastic package. For this purpose, coating particles in the form of nanoparticles are preferably used.

Such nanoparticles have the advantage that they are extremely small and have dimensions which are in the nanometer range so that an almost uniform coating can be achieved by the charged nanoparticles jumping from the carrier to the area of the structure to be coated. If the structure is then additionally preheated, such nanoparticles, due to their small volume, can be immediately liquefied and produce a uniform covering of the area to be coated with a liquid of the particle material.

In this context, polymers which melt on when thermally loaded such as, for example, thermoplastics and/or reactive resins, are preferably used as coating particles. These polymers can be filled with ceramics so that the coating can be adapted to the coefficient of expansion of the semiconductor chip and there are no problems of the coating peeling off.

A further possibility consists in using metals as coating particles. Such metal particles are charged exactly like insulating particles on the carrier and, therefore, can be easily removed from the carrier and can jump to the area of the structure with semiconductor chip to be coated. Metal particles enable entire conductor track patterns to be deposited on the areas of the structure with semiconductor chip with one method step.

It is also possible to achieve a sequence of metal depositions alternating with insulation layers as are needed in semiconductor technology with this method of sputtering on electrostatically charged coating particles. A further advantage of this method is the high speed at which such a relatively homogeneous coating with metal particles or with insulating particles of polymers can be achieved. For radiofrequency applications, it is also possible to use sintered ceramic particles as coating particles, the sintered ceramic particles, together with additives, being electrostatically deposited and the additives ensuring that the sintered ceramic particles grow together to form a coating at relatively low sintering temperature.

Finally, it is also possible to use as coating particles, particles which have organometallic compounds. In this arrangement, it is possible, via later post processing of the organometallic compounds in the form of irradiation or thermal loading, to liberate the metals from the organometallic compounds in such a manner that conductor tracks can be selectively obtained on the areas to be coated.

In a further preferred example of performing the method, a wafer-level package is electrostatically charged as structure comprising at least one semiconductor chip. In this method, such a wafer-level package has a multiplicity of semiconductor chips which are arranged in one plane and in which areas of plastic are provided between the semiconductor chips so that the plastic areas form a coplanar top together with the semiconductor chips. Such a coplanar top can be reinforced with the aid of the method according to the invention at the places at which there are insulation layers, while, at the same time, places which have external contact areas on the common plane of semiconductor chips and plastic package are kept free. On the other hand, it is also possible, as already mentioned above, that the wafer-level package is preheated so that the coating particles immediately become liquefied when they arrive on the wafer-level package and form a uniform insulating coating on the wafer-level package.

In a further embodiment of the method, it is provided that as the structure with semiconductor chip, a substrate is coated, with thinned semiconductor chips arranged thereon, which are electrostatically charged. During the electrostatic charging, it is necessary to ensure only that the carrier with the coating particles has an opposite polarity to the areas of the structure with semiconductor chip which are to be coated, and that the area to be coated does not permit any charge carrier exchange. If these prerequisites are met, both the thinned semiconductor chips and the substrate located between the semiconductor chips can be coated with the coating particles and the intermediate space between a semiconductor chip and the next adjacent semiconductor chip on the substrate can also be filled up completely by corresponding particles.

The coating particles, combining to form an insulating melt due to subsequent heating of the substrate, can be utilized for implementing a wafer-level package with thinned semiconductor chips. In these thinned semiconductor chips, the areas which do not have a thinned semiconductor chip can be almost perfectly filled up if the substrate is not heated up at the same time as the coating particles are applied. The semiconductor chips, in contrast, can be kept free of coating particles since the coating particles arriving on such thinned rears of semiconductor chips immediately become discharged and are then repelled by them if they have the same polarity as the thinned semiconductor chips. Thus, corresponding coating particles remain only on the substrate and completely fill up the intermediate spaces between the thinned semiconductor chips.

If it is intended to achieve that the electrostatic deposition on electrically conductive surfaces of the structure should lead to a coating, it is of advantage to coat these electrically conductive surfaces with an adhesion promotion layer before applying electrostatically charged particles. The adhesion promotion layer ensures, on the one hand, that the process of exchanging electrical charges on electrically conductive surfaces of the structure is delayed and, on the other hand, the adhesion promotion layer ensures that, even after the charge of the arriving particles has changed, the repelling electrostatic forces are overcome by the adhesion promotion layer so that a coating is produced not only on the insulated surfaces but can also be built up successfully on electrically conductive surfaces.

The carrier material is preferably a metal, especially since the particles can thus be charged relatively quickly with an opposite polarity to that of the structure. Nevertheless, there is a risk that the electrically conductive particles, after being charged, jump off the metal plate. To avoid this, the carrier plate is preferably aligned horizontally so that natural gravity ensures that particles charged electrostatically with the same polarity as the carrier plate remain on the carrier plate and only leave the carrier plate if an area with opposite polarity is provided opposite them. Instead of a metal plate, a metal-coated plate can also be used as carrier, the metal layer of which is electrostatically charged in order to facilitate the delivery of electrostatically charged coating particles arranged thereon.

In a further variant of the method, it is provided that, for a multi-layer coating, the areas of the structure to be coated are brought successively over a number of carriers with different coating particles. In this method, the coating particles can be melted on in each case between each of the coating cycles. It is thus possible to build up a stack of insulating and metallically conductive layers alternately on an area of the structure with semiconductor chip.

In summary, voltage is applied to a semiconductor chip or semiconductor wafer to be coated in order to charge it electrostatically, and the particle material is also charged, but with reverse polarity. Due to the different electrical charging, semiconductor chips or semiconductor wafers are coated with a polymer or an inorganic or hybrid material and this applied material can be heated in a further process step to change it into a so-called B-stage state. It is thus possible to use the method for generating a homogeneous layer of materials which are otherwise not available as liquid for a spraying process or a spinning process. The application can be repeated several times in order to carry out a thick coating, on the one hand, and also to generate sandwich-like layers, on the other hand.

This method is thus associated with the following advantages: non-dispensable materials can be applied such as, for example, heavily filled adhesives or molding materials; it is possible to use materials with extremely low thermal coefficients of expansion; the use of solvents can be dispensed with; it is possible to perform batch processes at wafer level; multiple coatings are possible; and this type of coating is compatible with wafer-level packaging and with dicing-before-grinding.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in greater detail with reference to the attached figures.

FIG. 1 shows a diagrammatic cross section through an electrostatically charged semiconductor chip.

FIG. 2 shows a diagrammatic cross section through the semiconductor chip according to FIG. 1 after positioning over a carrier with coating particles of opposite polarity.

FIG. 3 shows a diagrammatic cross section through the semiconductor chip according to FIG. 2, with adherent coating particles of opposite polarity.

FIG. 4 shows a diagrammatic cross section through the semiconductor chip according to FIG. 3 after the coating particles have melted together to form a coating on the semiconductor chip.

FIG. 5 shows a diagrammatic cross section through an electrostatically charged wafer-level package.

FIG. 6 shows a diagrammatic cross section through the wafer-level package according to FIG. 5 after positioning over a carrier with coating particles of opposite polarity FIG. 7 shows a diagrammatic cross section through the wafer-level package according to FIG. 6 with adherent coating particles of opposite polarity.

FIG. 8 shows a diagrammatic cross section through the wafer-level package according to FIG. 7 after the coating particles have melted on to form a coating on the wafer-level package.

FIG. 9 shows a diagrammatic cross section through an electrostatically charged substrate with thinned semiconductor chips.

FIG. 10 shows a diagrammatic cross section through the substrate according to FIG. 9 after positioning over a carrier with coating particles of opposite polarity.

FIG. 11 shows a diagrammatic cross section through the substrate according to FIG. 10 with adherent coating particles of opposite polarity.

FIG. 12 shows a diagrammatic cross section through the substrate according to FIG. 11 after the coating particles have melted together to form a coating on the substrate and the thinned semiconductor chips.

DETAILED DESCRIPTION

Figure 1:
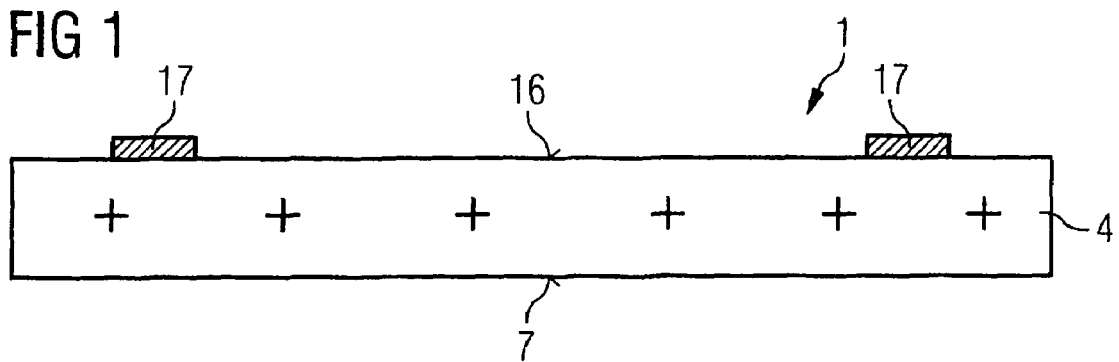
FIGS. 1-4 show basic diagrams of an electrostatic deposition of coating particles on a semiconductor chip according to a first embodiment of the invention.

FIGS. 1-4 show basic diagrams of an electrostatic deposition of coating particles 5 on a semiconductor chip 4 according to a first embodiment of the invention. FIG. 1 shows a diagrammatic cross section through an electrostatically charged semiconductor chip 4 as a structure 1 of a first embodiment of the invention. The semiconductor chip 4 has a top 16 and an area 7 to be coated on the underside. On its top 16, the semiconductor chip 4 has two contact areas 17 via which the semiconductor chip 4 can be charged electrostatically to, for example, a positive polarity.

Figure 2:
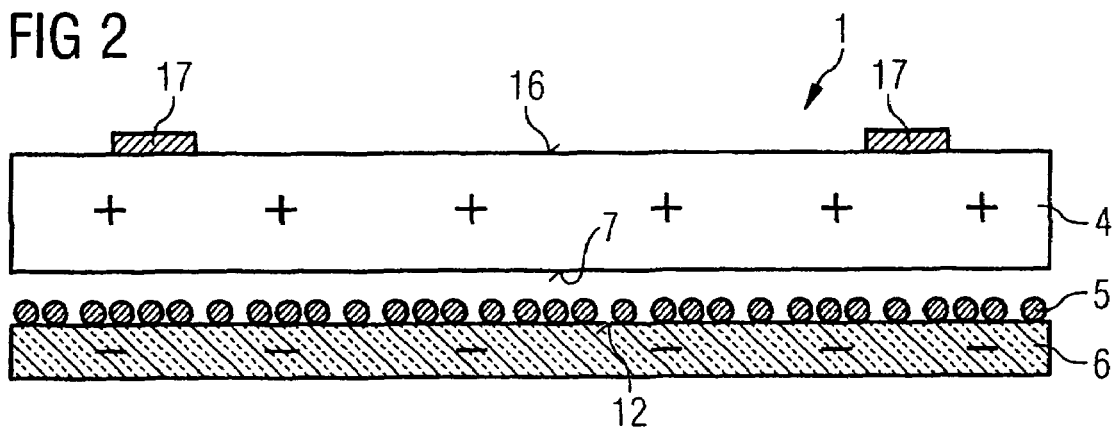

FIG. 2 shows a diagrammatic cross section through the semiconductor chip 4 according to FIG. 1 after positioning over a carrier 6 with coating particles 5 of opposite polarity. For this purpose, the area 7 of the semiconductor chip 4 to be coated is moved close enough to the carrier 6 with coating particles 5 on the top 12 of the carrier 6 that the coating particles 5 negatively charged via the carrier 6 coat the underside 7 of the semiconductor chip 4, overcoming the space between the carrier 6 and semiconductor chip 4.

Figure 3:
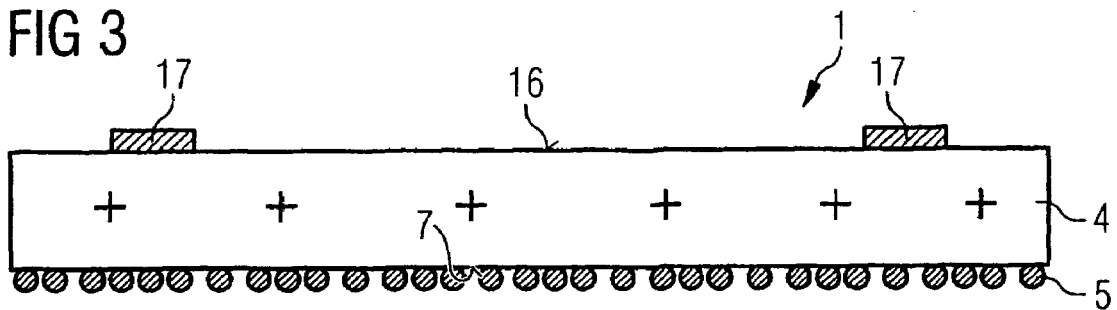

FIG. 3 shows a diagrammatic cross section through the semiconductor chip 4 according to FIG. 2 with adherent coating particles 5 of opposite polarity. So that the particles 5 do not exchange their negative charge for the positive charge of the semiconductor chip 4, the area 7 of the semiconductor chip 4 to be coated is first provided with an insulating layer such as silicon dioxide or silicon nitride. Instead of oxidic or nitridic insulation layers, the area 7 to be coated can also be coated with an adhesion promotor in order to achieve at least a temporary adherence of the coating particles 5 on the rear 7 of the semiconductor chip 4 to be coated. The bonding layer has the advantage that when the negative polarity of the coating particles 5 is exchanged for the positive polarity of the semiconductor chip 4, the coating particles 5 still remain on the area 7 to be coated.

Figure 4:
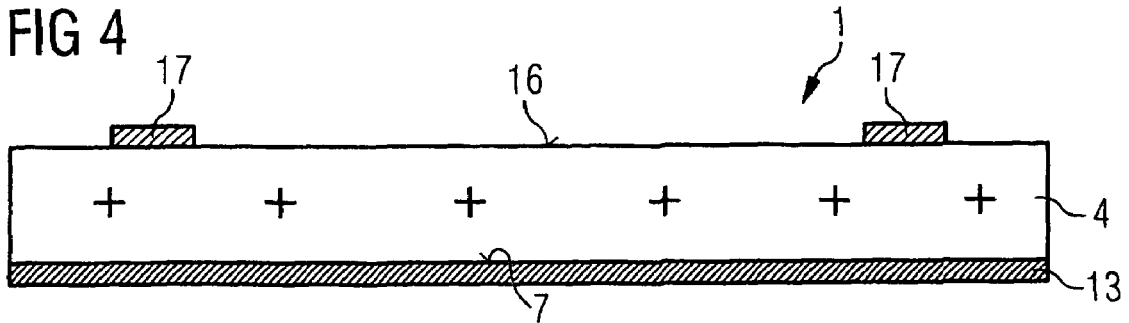

FIG. 4 shows a diagrammatic cross section through the semiconductor chip 4 according to FIG. 3 after the coating particles have melted together to form a coating 13 on the semiconductor chip 4. The more finely grained the application of the coating particles on the area 7 of the semiconductor chip 4 to be coated and the higher their number, the more homogeneous a coating 13 which can be produced by heating up the semiconductor chip 4 by melting together the coating particles. The method according to the invention can thus be used for achieving extremely thin layers in the nanometer range to thick coatings 13 of several tens of microns.

Using the electrostatic deposition according to the invention, semiconductor chips 4 can also be completely encapsulated with a coating 13 if the semiconductor chip 4 is immersed into a bath of coating particles 5 having the opposite polarity. It is of advantage here that the coating particles having the opposite polarity adhere only to the semiconductor chip 4 at places at which the exchange of electrical charges is not possible. The contact areas 17 thus remain completely free from being covered with coating particles without having to take special precautions for this purpose. Using electrostatic charging, solder resist layers can also be applied in a simple manner, in the case of which it is important that the external contact areas of semiconductor chips 4 remain free of the solder resist layer so that, for example, solder balls can be applied as flipchip contacts on the external semiconductor surfaces.

Figure 5:
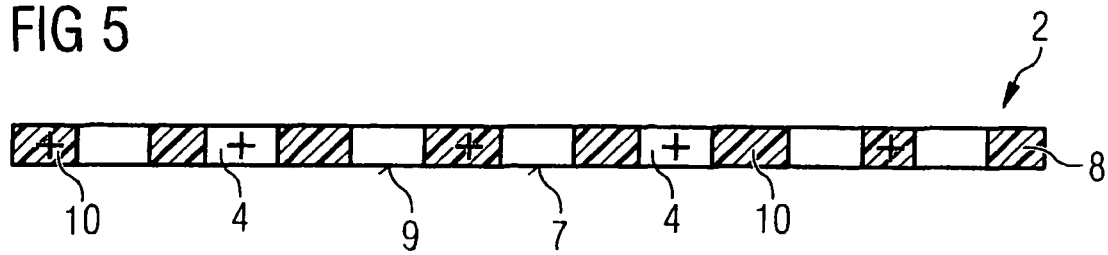
FIGS. 5-8 show basic diagrams of an electrostatic deposition of coating particles on a wafer-level package.

FIGS. 5-8 show basic diagrams of a structure 2 of a second embodiment of the invention with an electrostatic deposition of coating particles 5 on a wafer-level package 8. FIG. 5 shows a diagrammatic cross section through an electrostatically charged wafer-level package 8 which is built up of a plurality of semiconductor chips 4 alternating with plastic areas 10. In this arrangement, a common or coplanar plane 9 is formed which is to be protected with a coating in the present exemplary embodiment of the invention. This common area 9 comprises the insulating plastic areas 10 and the semiconductor chips 4 which have a closed passivation layer on the planar area 9 so that coating particles of opposite polarity can be electrostatically deposited.

Figure 6:
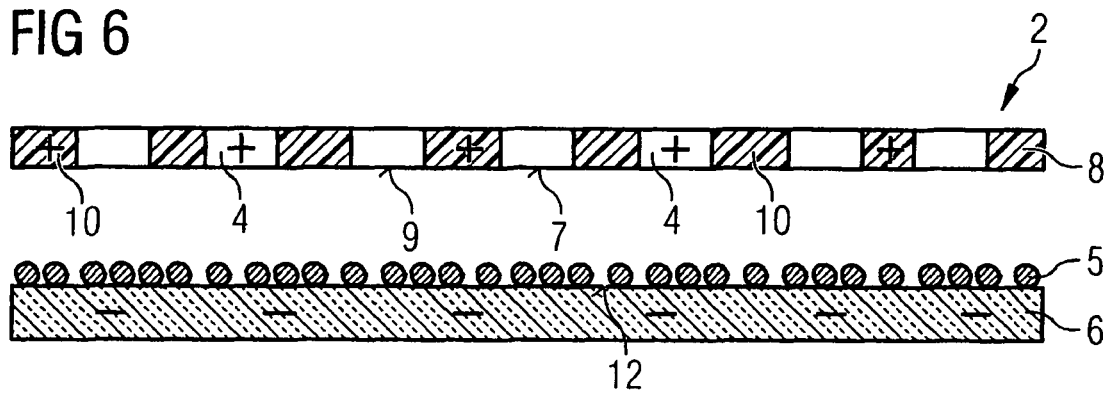

FIG. 6 shows how the wafer-level package 8 is charged, for example, to a positive polarity and is positioned over a carrier 6 having the opposite polarity, one side 12 of the carrier 6 carrying coating particles 5 which then also assume this negative polarity. If the space between the wafer-level package 8 and the carrier 6 is reduced, the coating particles 5 with opposite polarity to the wafer-level package 8 jump the space and adhere to the plane 9 of the wafer-level package 8 to be coated.

Figure 7:
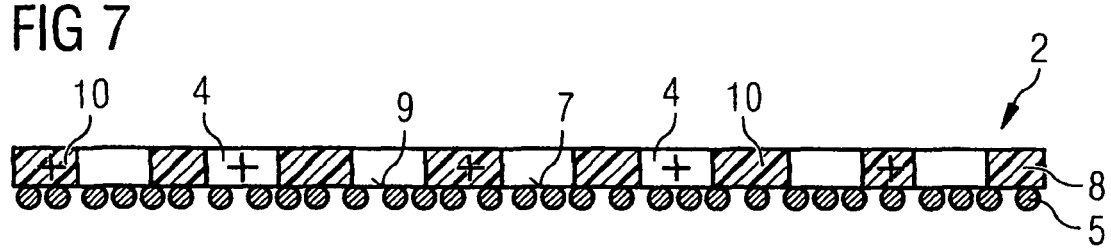

FIG. 7 shows a diagrammatic cross section through the wafer-level package 8 according to FIG. 6 with adherent coating particles 5 of opposite polarity. Since the surfaces 16 of the semiconductor chips 4 are provided with a corresponding insulation layer, a rapid exchange of electrical charges is not possible so that the coating particles 5 of opposite polarity temporarily adhere to the wafer-level package 8.

Figure 8:
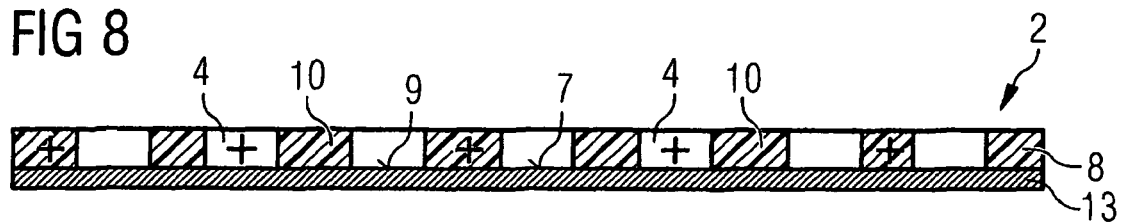

FIG. 8 shows a diagrammatic cross section through the wafer-level package 8 according to FIG. 7 after the coating particles have melted on to form a coating 13 on the wafer-level package 8. For this purpose, the wafer-level package 8 is heated up so that the coating particles are liquefied and form a homogeneous coating 13.

Figure 9:
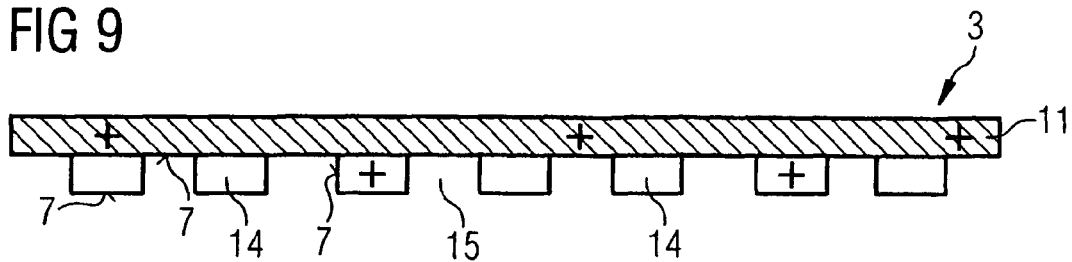
FIGS. 9 to 12 show basic diagrams of an electrostatic deposition of coating particles on a substrate with thinned semiconductor chips.

FIGS. 9-12 show basic diagrams of a structure 3 of a third embodiment of the invention with an electrostatic deposition of coating particles 5 on a substrate 11 with thinned semiconductor chips 14. FIG. 9 shows a diagrammatic cross section through an electrostatically charged substrate 11 with thinned semiconductor chips 14. For this purpose, the surfaces of the thinned semiconductor chips, particularly the thinly ground rear surfaces of the semiconductor chips 4, are provided with a passivation layer to avoid an exchange of charges between the thinned semiconductor chips 14 and the coating particles 5 from occurring, thereby preventing the particles from jumping off the thinned semiconductor chips 14 during the process of electrostatic deposition.

Figure 10:
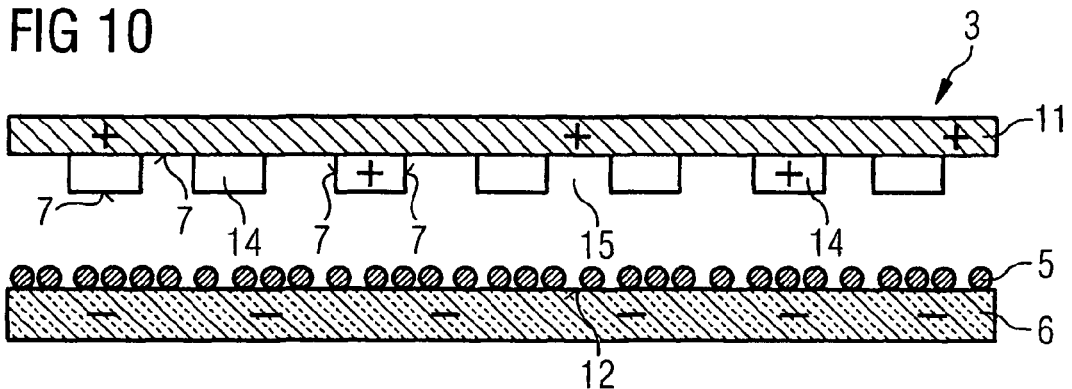

FIG. 10 shows a diagrammatic cross section through the substrate 11 according to FIG. 9 after positioning over a carrier 6 with coating particles 5 of opposite polarity. The negatively charged coating particles 5 jump the space between the substrate 11 with thinned semiconductor chips 14 and the side 12 of the carrier 6 as soon as the space has become small enough. The coating particles 5 cover the entire area 7 of the substrate 11 and of the thinned semiconductor chips 14, to be coated. Since the positive charges act in all directions, all areas, and thus also the edges of the thinned semiconductor chips 14, are covered with corresponding coating particles 5 of opposite polarity.

Figure 11:
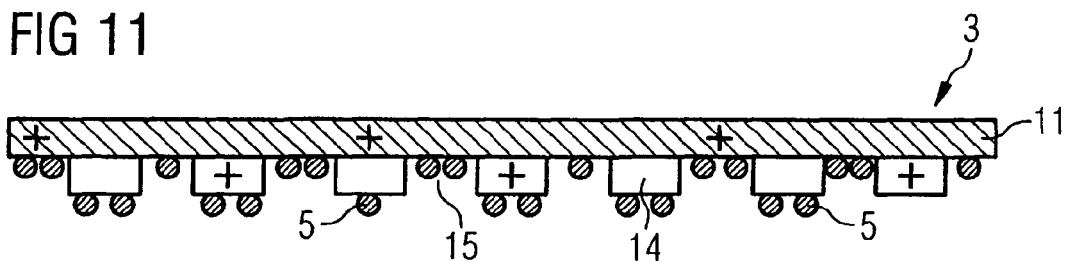

FIG. 11 shows a diagrammatic cross section through the substrate 11 according to FIG. 10 with adherent coating particles 5 of opposite polarity. As already mentioned above, the coating particles 5 are distributed over all areas of the thinned semiconductor chips 14, i.e., the rears and the edges, and the substrate if no charge exchange can take place between the coating particles 5 and the surfaces 16 of the semiconductor chips 14.

Figure 12:
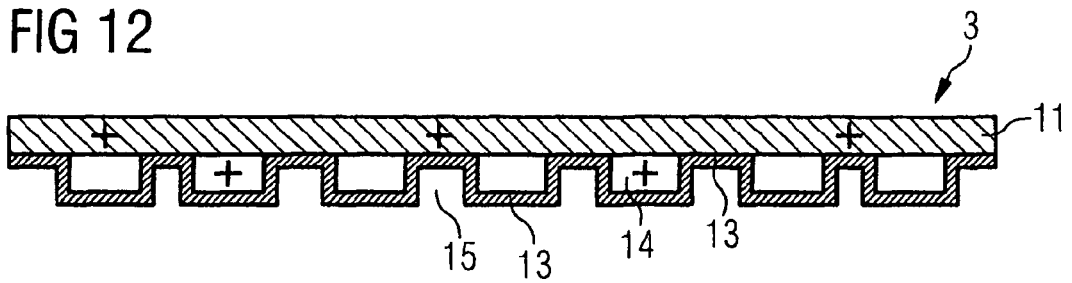

FIG. 12 shows a diagrammatic cross section through the substrate 11 according to FIG. 11 after the coating particles have melted together to form a coating 11 on the substrate 11 and the thinned semiconductor chips 14. The advantage of such a coating 13 is that it follows all steps in height and is formed in uniform thickness both on the edges of the semiconductor chips 14 and on the rear surfaces of the semiconductor chips 14. If it is intended to prevent the rear surfaces of the semiconductor chips 14 from being covered with the coating 13, it is ensured only that no passivating oxide layers form on the thinly ground rear surfaces as is shown in FIG. 13.

Figure 13:
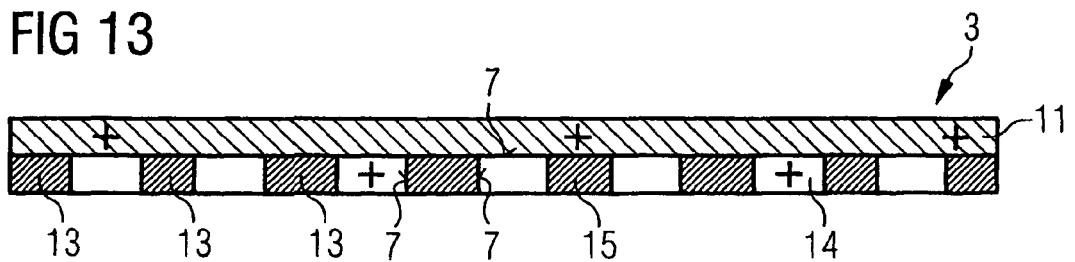
FIG. 13 shows a diagrammatic cross section through the substrate according to FIG. 9 after the intermediate spaces between the thinned semiconductor chips have been electrostatically filled up with coating particles melted together to form a coating.

FIG. 13 shows a diagrammatic cross section through the substrate 11 according to FIG. 9 after the intermediate spaces 15 between the thinned semiconductor chips 14 have been electrostatically filled up with coating particles melted together to form a coating 13. In this embodiment of the invention, the rear surfaces of the thinned semiconductor chips 14 are kept free of any passivation layer so that an exchange of charges can occur between coating particles jumping on and the thinned semiconductor chips 4, and the rear surfaces thus remain completely free of coating particles and only the intermediate spaces and the insulated edges of the thinned semiconductor chips 4 on the area 7 of the substrate 11 to be coated are covered with coating particles until the intermediate spaces 15 are completely filled with a corresponding coating 13. FIG. 13 is thus an example of how a wafer-level package can be produced via the method according to the invention.

Having described exemplary embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

1 Structure with semiconductor chip (first embodiment)
2 Structure with semiconductor chip (second embodiment)
3 Structure with semiconductor chip (third embodiment)
4 Semiconductor chip
5 Coating particle
6 Carrier
7 Area to be coated
8 Wafer-level package
9 Plane of the wafer-level package
10 Areas of plastic
11 Substrate with semiconductor chips
12 Side of the carrier with coating particles
13 Coating
14 Thinned semiconductor chip
15 Intermediate spaces between the semiconductor chips
16 Top of the semiconductor chip
17 Contact areas

What is claimed is:

1. A method for coating a structure including at least one semiconductor chip, the method comprising:
    applying coating particles to a carrier;
    electrostatically charging the coating particles;
    electrostatically charging the structure to a polarity opposite to the coating particles;
    placing the carrier and the structure in proximity to each other to produce an electrostatic force between the coating particles and the structure such that the coating particles move from the carrier and adhere to an area of the structure to be coated in response to the electrostatic force; and
    liquefying the coating particles located on the area of the structure to be coated via heating.

2. The method as claimed in claim 1, wherein the structure is preheated such that the coating particles are liquefied upon arrival on the area of the structure to be coated.

3. The method as claimed in claim 1, wherein the coating particles comprise nanoparticles.

4. The method as claimed in claim 1, wherein coating particles comprise polymers.

5. The method as claimed in claim 1, wherein the coating particles comprise filled polymers.

6. The method as claimed in claim 1, wherein the coating particles comprise metals.

7. The method as claimed in claim 1, wherein the coating particles comprise sintered ceramic particles.

8. The method as claimed in claim 1, wherein the coating particles comprise organometallic compounds.

9. The method as claimed in claim 1, wherein the structure comprises a wafer-level package including a plurality of semiconductor chips located in a common plane and areas of plastic located between the semiconductor chips.

10. The method as claimed in claim 1, wherein the structure comprises a substrate with thinned semiconductor chips arranged thereon.

11. The method as claimed in claim 1, wherein electrically conductive surfaces of the structure are coated with an adhesion promotion layer prior to electrostatic deposition.

12. The method as claimed in claim 1, wherein the carrier comprises a metal plate.

13. The method as claimed in claim 1, wherein the carrier comprises a metal-coated plate.

14. The method as claimed in claim 1, wherein the coating particles are arranged on a horizontal surface of the carrier.

15. The method as claimed in claim 1, further comprising forming a multi-layer coating on the area of the structure to be coated by successively placing the structure in proximity to a plurality of carriers with different coating particles.

16. The method as claimed in claim 15, wherein the coating particles deposited on the area are melted between the coating cycles.

* * * * *